United States Patent [19]
Clark

[11] 3,890,698
[45] June 24, 1975

[54] FIELD SHAPING LAYER FOR HIGH VOLTAGE SEMICONDUCTORS

[75] Inventor: Lowell E. Clark, Scottsdale, Ariz.

[73] Assignee: Motorola, Inc., Chicago, Ill.

[22] Filed: Dec. 3, 1973

[21] Appl. No.: 421,377

Related U.S. Application Data

[62] Division of Ser. No. 194,380, Nov. 1, 1971, abandoned.

[52] U.S. Cl. ..................... 29/577; 29/576; 29/580; 29/620

[51] Int. Cl. ............................................. B01j 17/00

[58] Field of Search .......... 317/235 D; 29/577, 576, 29/578, 580, 620, 610

[56] References Cited

UNITED STATES PATENTS

| | | | |
|---|---|---|---|
| 3,562,608 | 3/1969 | Gallagher | 317/235 |
| 3,576,478 | 4/1971 | Watkins | 29/578 |

FOREIGN PATENTS OR APPLICATIONS

| | | | |
|---|---|---|---|
| 2,031,082 | 4/1971 | Germany | 317/235 |

*Primary Examiner*—W. Tupman
*Attorney, Agent, or Firm*—Vincent J. Rauner; Charles R. Hoffman; Ellen P. Trevors

[57] ABSTRACT

There is disclosed a resistive film having inhomogeneous properties overlaying the passivation layer normally used between the central metal overlay and a guard ring structure of a high power semiconducting device for providing a uniform field distribution between the guard ring and the metal overlay. The resistive film counteracts the effects of charge resulting from finite semiconductor doping and surface contaminants on the passivation film to reduce peak fields when high voltages are applied across the device. Non-uniformities are introduced in the resistive film in the form of high resistivity voids or low resistivity doped areas to counteract the non-uniform field distribution in the film caused by the difference in the radius of curvatures of the central metal overlay and the guard ring structure. The use of an inhomogeneous resistive layer to control the potential between the guard ring and central metal overlay allows the production of high voltage semiconductor devices having breakdown voltages higher than can be achieved through the use of uniform resistivity films or other field shaping techniques.

4 Claims, 3 Drawing Figures

FIELD SHAPING LAYER FOR HIGH VOLTAGE SEMICONDUCTORS

This is a division, of application Ser. No. 194,380, filed Nov. 1, 1971, now abandoned.

BACKGROUND

This invention relates to high voltage semiconductor devices and more particularly to semiconductor devices having resistive films deposited between the electrodes of a semiconductor to provide a uniform surface field distribution between the electrodes.

Resistive films have been employed between electrodes of semiconductor devices to increase the breakdown voltage of the devices by assuring that the electric field is evenly distributed between the electrodes. One such system is described in co-pending U.S. Pat. application, Ser. No. 85,638 entitled "High Voltage Passivation" filed Oct. 30, 1970, by the same inventor and assigned to the same assignee. In the aforementioned application, there is disclosed a resistive film deposited between the central metal overlay and a guard ring structure to provide a uniform field distribution between the guard ring and metal overlay.

Whereas this technique provides a useful way to increase the breakdown voltage of a semiconductor, the technique is of limited utility when applied to small geometry devices. The electric field distribution in a device of the aforementioned type, tends to be greater near the central metal overlay than near the guard ring. This effect is exaggerated in small geometry devices, and the high field strength near the central metal overlay causes premature breakdown of the device. The nonuniformity of the electric field between the central metallic overlay and the outer guard ring limits the minimum radius of curvature that may be used in a high voltage device.

SUMMARY

Accordingly, it is an object of the present invention to provide a field shaping resistive film that provides a uniform electric field between the electrodes of a semiconductor device.

It is another object of this invention to provide a small geometry semiconductor device having high breakdown voltages.

It is a further object of this invention to reduce the physical size of high voltage semiconductor devices.

It is yet another object of this invention to reduce the cost of high voltage semiconductor devices through simplified processing and chip-size reduction.

In accordance with a preferred embodiment of the invention, a nonuniform resistive film is deposited between the electrodes of a high voltage semiconductor device. The nonuniformities may take the form of heavily doped low resistivity regions or high resistivity voids. The voids and low resistivity regions are arranged so as to increase the resistance of the film in regions having a relatively low electric field, thereby causing the field to shift away from the high electric field regions that result as a consequence of device geometry.

The field shaping technique of the present invention is equally applicable to all high voltage semiconductor devices, including transistors, diodes and thyristors.

DETAILED DESCRIPTION

Figure 1:
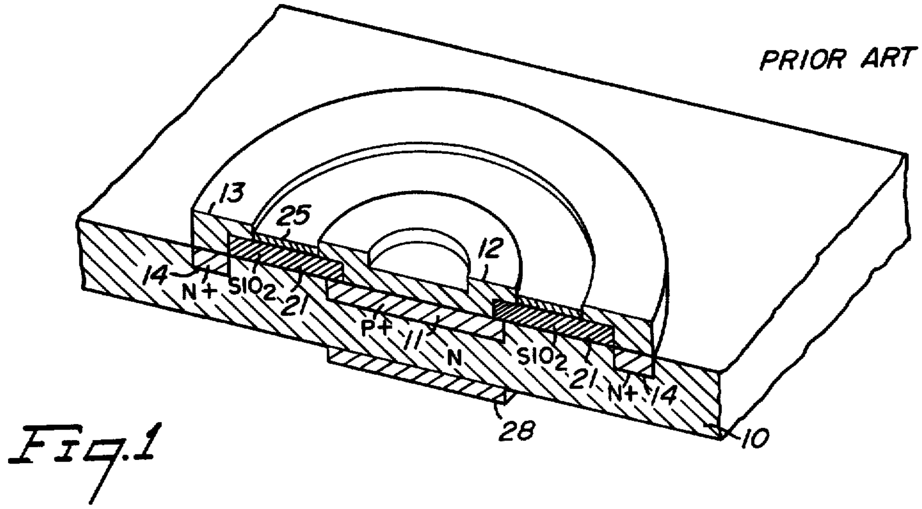
FIG. 1 is a perspective cross sectional view of a diode utilizing a resistive film in order to achieve a uniform field distribution, and is used in explaining prior art.

Referring to FIG. 1, a typical high voltage annular diode having resistive film high voltage passivation according to prior art is shown. In this figure, a diode is formed by an N-type body region 10 and a P+ region 11. A typical metal junction overlay 12 forms the ohmic contact to the P+region, and a second metal contact 28 forms an ohmic contact to the N-type body region 10. The external closed guard ring is shown in cross section at 13 in ohmic contact with diffused N+ regions shown in cross section at 14. A layer of silicon dioxide, shown in cross section at 21, is deposited over the N-type material between metal overlay 12 and guard ring 13 to protect the P+ to N junction from contamination. A resistive film 25 is deposited over silicon dioxide layer 21 between metal overlay 12 and guard ring 13. The resistive film has a sheet resistance which is lower than the sheet resistance of the silicon dioxide so that the distribution of the electric field resulting from a potential difference applied between metal overlay 12 and guard ring 13 is determined by resistive film 25 rather than silicon dioxide passivation layer 21.

The resistive layer is generally approximately one micron thick. The resistance of the resistive layer is several megohms so that it will not cause excessive leakage at the operating voltage of the device. A resistive film consisting of material, such as, for example, polycrystalline silicon or aluminum-aluminum oxide, the latter commonly referred to as a cermet film, is used because it has a sheet resistance range of about $10^6$ to $10^{10}$ ohms per square. Films having a sheet resistance in excess of $10^{10}$ ohms per square are preferred although films having $10^9$ ohms per square have proven satisfactory. These films have sufficient conductivity such that the potential drops nearly linearly between the metal overlay 12 and the guard ring metal 13, even in the presence of external contaminants in silicon dioxide layer 21 which would cause a non-uniform field distribution in the absence of resistive layer 25. The aforementioned technique of utilizing an electric field determining resistive film to provide a uniform electric field between two electrodes of a semiconductor to increase the breakdown voltage of the semiconductor is described in co-pending U.S. Pat. application, Ser. No. 85,638 entitled "High Voltage Passivation" filed Oct. 30, 1970 by the same inventor and assigned to the same assignee.

The aforementioned technique provides a significant increase in the high voltage performance of most devices. For example, the breakdown voltage of diodes has been increased from approximately 500 volts to over 2000 volts by the application of resistive layer 25. However, in small geometry devices, the electric field tends to build up near the central metal overlay 12, thereby causing premature breakdown, even though resistive film 25 is present. Hence, the application of uniform resistive films such as film 25 provides a useful improvement in high voltage performance only for devices having moderate and large geometries.

Figure 2:
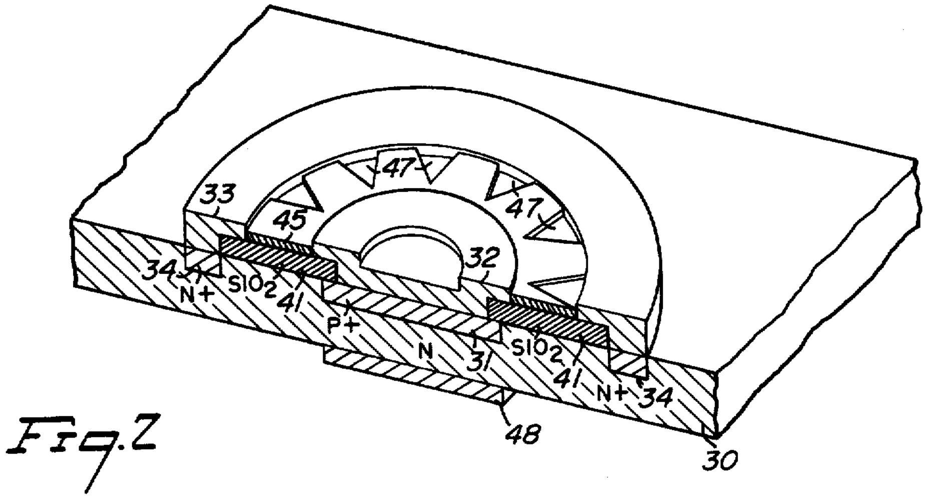
FIG. 2 is a perspective cross sectional view of a diode utilizing a nonuniform resistive film according to the invention, wherein the nonuniformities in the resistive film are formed by voids.

FIG. 2 shows a high voltage annular diode having a non-uniform resistive film according to the invention. The diode is formed by an N-type body region 30 and a P+ region 31. A metal junction overlay 32 forms the ohmic contact to P+ region 31 and a metal guard ring 33 forms an ohmic contact with an N+ region 34 diffused into body 30. A second metal contact 48 forms an ohmic contact with the N-type body to provide the cathode connection to the diode. Silicon dioxide layer 41 serves as the passivation layer to protect the junction between P+ region 31 and body 30. A resistive film 45 having a multiplicity of voids 47 near guard ring 33 is deposited over silicon dioxide layer 41.

In devices using a resistive film between central metal overlay 32 and guard ring 33, the electric field tends to build up near the central metal overlay 32 because of the difference in circumference between overlay 32 and guard ring 33. This effect is negligible for large geometry devices, but tends to limit the maximum breakdown voltage of small devices. By making resistive film 45 nonuniform, the shape of the electric field can be varied to reduce the buildup near overlay 32. In operation, a small amount of current flows between overlay 32 and guard ring 33, which is at substantially the same potential as contact 48, through resistive film 45. The field in resistive film 45 is determined by the density of the current flow therethrough and by the sheet resistance of film 45. Placing a series of high resistivity areas in the form of voids 47 in film 45 near guard ring 33 causes the current to flow through the sections of resistive film 45 between voids 47, thereby increasing the current density and the electric field in the areas between voids 47. This shifts the field away from metal overlay 32 toward guard ring 33, thereby reducing the field buildup near overlay 32, and eliminates premature voltage breakdown due to the high field near overlay 32. Although triangular voids are shown, any shape providing the desired field shift may be used.

Figure 3:
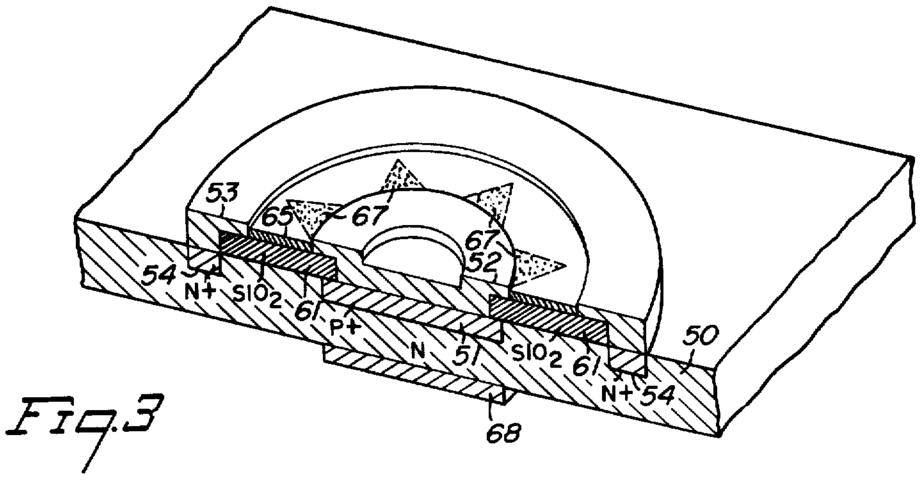
FIG. 3 is a perspective cross sectional view of a diode utilizing a nonuniform resistive film according to the invention, wherein the nonuniformities in the resistive film are formed by regions doped with impurities.

FIG. 3 shows another embodiment of a high voltage diode utilizing a nonuniform resistive film according to the invention. In this figure, a diode is formed by an N-type body region 50 and a P+ region 51. A metal overlay 52 is used to make ohmic contact with the P+ region, and a metallic guard ring 53 makes an ohmic contact with a diffused N+ region 54. A metal contact 68 forms an ohmic contact with the N-type body to provide the cathode connection to the diode. A silicon dioxide layer 61 provides passivation and a nonuniform resistive layer 65 provides electric field shaping between overlay 52 and guard ring 53. Low resistivity areas 67 near overlay 52 provide the nonuniformities for film 65. The resistivity of regions 67 may be lowered by techniques such as, for example, doping. Although triangular areas are shown in this embodiment, any shape that provides the desired field characteristics, may be used.

In operation, a current flows between metal overlay 52 and guard ring 53 through resistive film 65. The current density in film 64 is greater near overlay 52 than near guard ring 53 due to the difference in circumference between the outer dimension of overlay 52 and the inner dimension of guard ring 53. Hence, if film 65 were uniform, the electric field would be greater near overlay 52 than near guard ring 53. The introduction of low resistivity areas 67 reduces the resistivity of film 65 near overlay 52, thereby reducing the voltage drop through film 65 in the region of maximum current density near overlay 52. This technique effectively shifts the field away from overlay 52 to provide a more uniform field between overlay 52 and guard ring 53.

Although the present invention has been illustrated as applied to annular diodes having an N-type body region and a diffused P+ region, it should be noted that the invention is applicable to any semiconductor device including diodes of either conductivity type, transistors and thyristors.

In summary, the present invention provides a way to substantially increase the breakdown voltage of a semiconductor device, and to substantially reduce the size of the high voltage semiconductor devices without sacrificing high voltage performance. This permits the fabrication of smaller size high voltage devices, thereby reducing the amount of silicon required per device, increasing yield and reducing the cost of high performance high voltage devices.

I claim:

1. A method for increasing the breakdown voltage of a semiconductor device having a first region of a first conductivity type having an upper surface, a second region of a second conductivity type located in said first region and in contact with said upper surface thereof, a third region of a higher doping concentration of said first conductivity type located in said first region in contact with said upper surface thereof and spaced from said second region, a first conductive terminal making an ohmic contact with said first region, a second conductive terminal having an outer boundary having a curved portion and making an ohmic contact with said second region, and a third conductive terminal located outside said second conductive terminal and making an ohmic contact with said third region, said third conductive terminal having an inner boundary having a curved portion and being spaced apart from said second conductive terminal forming a space between said respective curved portions thereof, said method comprising the steps of:

applying a resistive material to said space between said respective curved portions thus making contact with said second and third terminals and forming a series of higher resistivity areas and lower resistivity areas in said resistive material with the higher resistivity areas being concentrated adjacent said third terminal to cause the electric field created through the application of a voltage to said terminals to be uniform between said second and third terminals.

2. The method for increasing the breakdown voltage of a semiconductor device as recited in claim 1 wherein the forming step includes selectively depositing said resistive material to define voids therein for providing areas of higher resistance.

3. The method for increasing the breakdown voltage of a semiconductor device as recited in claim 1 wherein the forming step includes selectively removing portions of said resistive material to define voids therein for providing areas of higher resistance.

4. The method for increasing the breakdown voltage of a semiconductor device as recited in claim 1 wherein the forming step includes selectively adding impurities to said resistive material to define areas of lower resistance.

* * * * *